United States Patent
Choi

(10) Patent No.: US 7,541,668 B2
(45) Date of Patent: Jun. 2, 2009

(54) PACKAGE FRAME AND SEMICONDUCTOR PACKAGE USING THE SAME

(75) Inventor: Yoon-hwa Choi, Incheon Metropolitan (KR)

(73) Assignee: Fairchild Korea Semiconductor, Ltd. (KR)

( * ) Notice: Subject to any disclaimer, the term of this patent is extended or adjusted under 35 U.S.C. 154(b) by 168 days.

(21) Appl. No.: 11/475,276

(22) Filed: Jun. 27, 2006

(65) Prior Publication Data

US 2007/0034994 A1 Feb. 15, 2007

(30) Foreign Application Priority Data

Jun. 27, 2005 (KR) .................. 10-2005-0055907

(51) Int. Cl.
*H01L 23/495* (2006.01)
*H01L 23/48* (2006.01)

(52) U.S. Cl. ............... 257/676; 257/666; 257/E23.061; 257/784

(58) Field of Classification Search ............ 257/666, 257/670, 675, 676, 784, E23.061
See application file for complete search history.

(56) References Cited

U.S. PATENT DOCUMENTS

| | | | | |
|---|---|---|---|---|
| 6,150,709 A * | 11/2000 | Shin et al. | ................ | 257/666 |
| 6,281,568 B1 * | 8/2001 | Glenn et al. | ................ | 257/684 |
| 6,424,025 B1 * | 7/2002 | Liu | ................ | 257/668 |
| 6,927,483 B1 * | 8/2005 | Lee et al. | ................ | 257/676 |
| 6,953,988 B2 * | 10/2005 | Seo et al. | ................ | 257/666 |
| 7,087,462 B1 * | 8/2006 | Park et al. | ................ | 438/112 |
| 7,338,841 B2 * | 3/2008 | Lau | ................ | 438/124 |
| 2005/0156291 A1 * | 7/2005 | Shiu et al. | ................ | 257/666 |
| 2005/0206010 A1 * | 9/2005 | Noquil et al. | ................ | 257/778 |

\* cited by examiner

*Primary Examiner*—Nitin Parekh
(74) *Attorney, Agent, or Firm*—Robert D. Lott, Esq.; Thomas R. FitzGerald, Esq.; Hiscock & Barclay, LLP

(57) ABSTRACT

Provided are a lead frame and a semiconductor package which allows reliable attachment of a small-sized semiconductor chip requiring a large number of leads to a board while providing high heat dissipation capability. The semiconductor package includes leads, each having a top plate extending inward from the outside edge of a frame and a plurality of pillar-shaped portions supporting the top plates, a semiconductor chip attached onto edge portions of the leads, wires connecting the leads with corresponding bonding pad on the semiconductor chip, and a molding material encapsulating the semiconductor chip and the wires and parts of the leads so as to the bottom surfaces of the leads are exposed. Further, some embodiments have a conductive pad exhibiting higher heat dissipation.

13 Claims, 12 Drawing Sheets

PACKAGE FRAME AND SEMICONDUCTOR PACKAGE USING THE SAME

CROSS-REFERENCE TO RELATED PATENT APPLICATION

This application claims the benefit of Korean Patent Application No. 10-2005-0055907, filed on Jun. 27, 2005, in the Korean Intellectual Property Office, the disclosure of which is incorporated herein in its entirety by reference.

BACKGROUND OF THE INVENTION

1. Field of the Invention

The present invention relates to a semiconductor package for protecting a semiconductor chip and a lead frame for the semiconductor package, and more particularly, to a molded leadless package (MLP) and a lead frame for the MLP.

2. Description of the Related Art

A semiconductor package includes a semiconductor chip attached to a lead frame and encapsulated with a molding material. As an operating voltage of a predetermined magnitude is applied to a device within a semiconductor chip, a significant amount of heat is generated in the semiconductor chip. The heat generation problem becomes more severe for power semiconductor chips with high operating voltage. Thus, the ability of a semiconductor package to dissipate heat generated in a semiconductor chip away through an external board can significantly affect its stability and reliability. Recently, MLPs designed to allow heat to efficiently escape from the semiconductor chip and with a reduced area have been used in a wide variety of applications.

For example, as discussed in U.S. Pat. No. 6,437,429 titled "SEMICONDUCTOR PACKAGE WITH METAL PADS" for which application was filed by Chun-Jen Su, et al., on May 11, 2001, a semiconductor chip is fixed onto a die pad and a metal pad is formed on a downside surface of a lead. A gap is formed between the metal pad and the cutting surface of the lead using a half-etching method and filled with a molding material during the manufacture of a semiconductor package. This reduces the thickness of the cutting surface of the lead while preventing formation of a cutting sharp edge at the brim of metal pads.

However, as the speed and integration density of a semiconductor chip increase, the number of bonding pads on the semiconductor chip for connecting the semiconductor chip with external device increases. This results in an increase in the number of leads in a semiconductor package corresponding to the bonding pads. This increase in turn increases the size of the semiconductor package because it is difficult to increase the number of leads in a semiconductor package with a predetermined size and predefined minimum lead pitch.

Further, the size of a semiconductor chip and a semiconductor package is decreasing as the demands for smaller electronic devices using semiconductor chips increase. Thus, increasing the size of a semiconductor package in order to increase the number of leads results in failure to properly mount a high-integrated, small-sized semiconductor chip on a lead. Even when the semiconductor chip is mounted on the half-etched thin lead, the lead or the semiconductor chip may be damaged due to bouncing during wire bonding between the semiconductor chip and the lead.

Furthermore, when a conventional MLP is mounted onto a board using solder, a solder bond may be formed only at an edge of the semiconductor package, thus reducing a package to board attachment reliability. When the conventional MLP is attached onto a board having a via hole, air trap may occur within the via hole.

SUMMARY OF THE INVENTION

The present invention provides a semiconductor package with a small-sized semiconductor chip reliably attached to a large number of leads and which is able to achieve improved mounting reliability after mounting it onto a board.

The present invention also provides a package frame that can be used for a semiconductor package including a semiconductor chip reliably attached to a large number of leads.

According to an aspect of the present invention, there is provided a semiconductor package including: a plurality of first conductive leads, each including first and second pillar-shaped portions and a top plate covering the first and second pillar-shaped portions, which are spaced apart from one another and arranged such that the second pillar-shaped portions face inward; a semiconductor chip having a top surface on which a plurality of bonding pads are disposed and edge portions attached onto edges of top plates of the first conductive leads; a plurality of first conductive wires connecting at least some of the bonding pads on the semiconductor chip with corresponding ones of the first conductive leads; and a molding material encapsulating the semiconductor chip and the first conductive wires and parts of the first conductive leads so as to expose at least bottom surfaces of the first and second pillar-shaped portions of the first conductive leads.

The semiconductor package further includes a conductive pad attached onto a central portion of a bottom surface of the semiconductor chip and disposed at a central portion inside the first conductive leads, wherein the molding material further encapsulates a portion of the conductive pad so as to expose the bottom surface of the conductive pad.

Alternatively, the semiconductor package may include: a plurality of first conductive leads, each including spaced-apart first and second pillar-shaped portions and a top plate covering the first and second pillar-shaped portions, which are spaced apart from one another and arranged such that the second pillar-shaped portions face inward; a plurality of second conductive leads, each including a third pillar-shaped portion and a top plate covering the third pillar-shaped portion, which are spaced apart from and arranged alternately with the first conductive leads, wherein the third pillar-shaped portion is disposed between the first and second pillar-shaped portions of the first conductive lead; a semiconductor chip having a top surface on which a plurality of bonding pads are disposed and edge portions attached onto at least edges of top plates of the first conductive leads; a plurality of conductive wires connecting the bonding pads on the semiconductor chip with corresponding ones of the first and second conductive leads; and a molding material encapsulating the semiconductor chip and the plurality of conductive wires and parts of the first and second conductive leads so as to expose at least bottom surfaces of the first and second pillar-shaped portions of the first conductive leads and the third pillar-shaped portions of the second conductive leads. The semiconductor package may further include a conductive pad attached beneath a bottom surface of the semiconductor chip and disposed at a central portion inside the first and second conductive leads, wherein the molding material further encapsulates a portion of the conductive pad so as to expose the bottom surface of the conductive pad.

According to another aspect of the present invention, there is provided a lead frame for a semiconductor package, including: a plurality of first conductive leads, each including first and second pillar-shaped portions and a top plate covering at least the first and second pillar-shaped portions, which are spaced apart from one another and arranged such that the second pillar-shaped portions face inward; and a frame fixing the first conductive leads and defining a cutting region for separating the first conductive leads and a semiconductor chip mounting region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
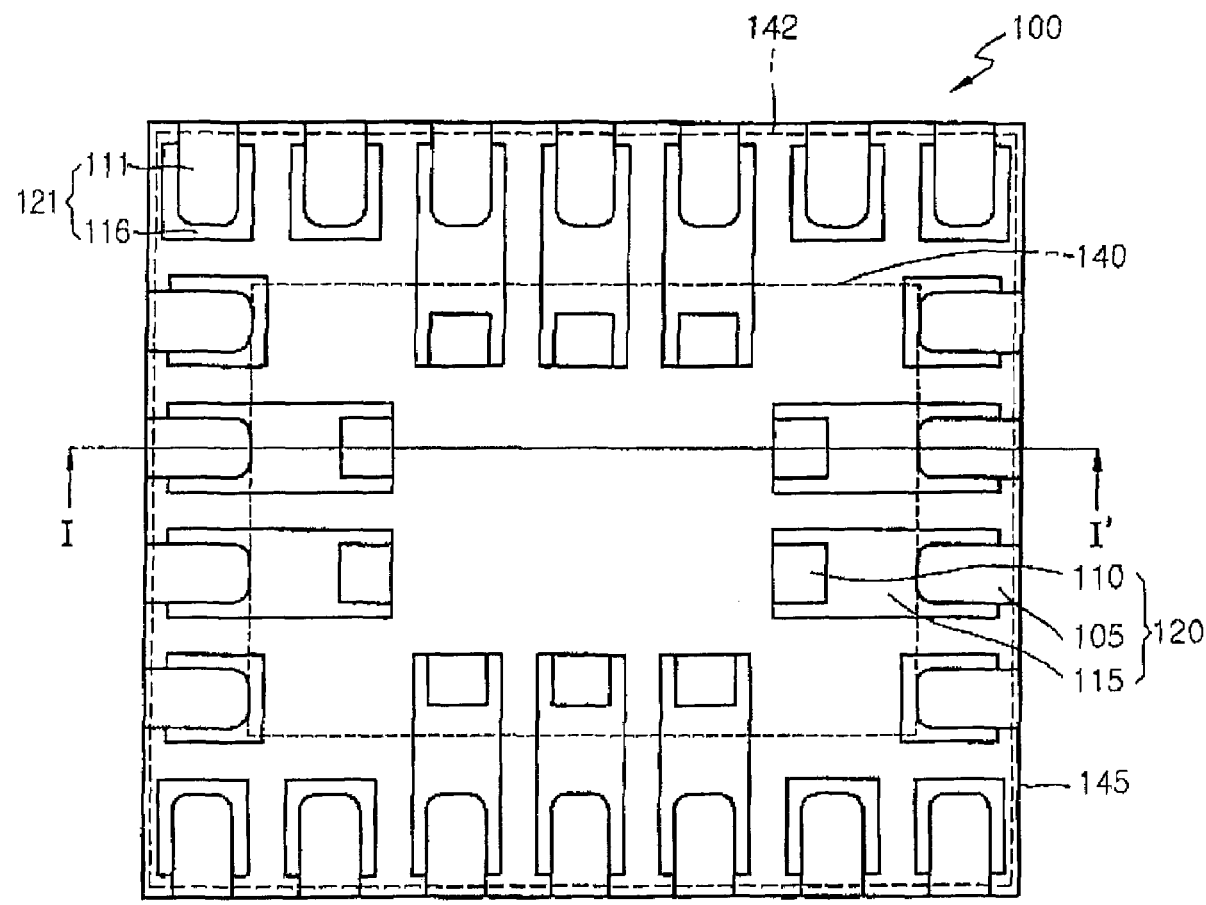
FIGS. 1 and 3 are schematic bottom views of a lead frame according to a first embodiment of the present invention.

The present invention will now be described more fully with reference to the accompanying drawings, in which exemplary embodiments of the invention are shown. In the drawings, the sizes of components are exaggerated for better visualization.

First Embodiment

Referring to FIG. 1, the lead frame 100 includes a plurality of conductive leads 120 that are spaced apart from one another and a frame 145 holding the plurality of conductive leads 120 in place. A cutting region 142 for cutting the leads 120 and a semiconductor chip mounting region 140 are defined within the frame 145. While FIG. 1 shows that the plurality of conductive leads 120 are arranged within a single frame 145, it will become obvious to those skilled in the art that one lead frame 100 may include a plurality of frames 145 arranged in a matrix.

For example, lead frames may be classified into a sawing type lead frame and a punch type lead frame. The sawing type lead frame includes the plurality of frames 145 arranged so as to be cut and separated using a sawing process while the punch type lead frame includes the plurality of frames 145 arranged such that they are cut and separated using a punching method.

Figure 2:
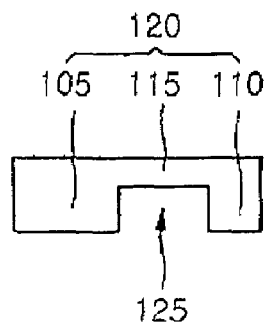
FIG. 2 is a cross-sectional view taken along line I-I' of the lead frame of FIG. 1.
Figure 2:
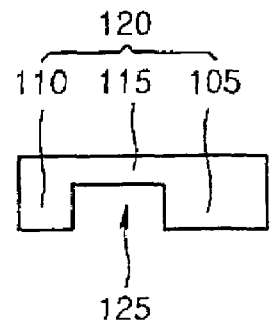

Referring to FIGS. 1 and 2, each of the plurality of conductive leads 120 includes a first pillar-shaped portion 105, a second pillar-shaped portion 110, and a top plate 115 covering the first and second pillar-shaped portions 105 and 110. A gap 125 is formed between the first and second pillar-shaped portions 105 and 110. Although FIG. 2 shows the first and second pillar-shaped portions 105 and 110 are shaped like a rectangular prism, they may have various other shapes such as a triangular prism, a cylinder, and a pentagonal prism. The top plate 115 may extend further outside the pillar-shaped portions 105 and 110. The pillar-shaped portions 105 and 110 and the top plate 115 may be formed of lead (Pb), gold (Au), platinum (Pt), copper (Cu), tin (Sn), or an alloy of the metals.

The leads 120 are arranged so that the second pillar-shaped portions 110 face the inside of the frame 145. The first pillar-shaped portion 105 mainly acts as an external terminal connected to a circuit on a board (180 of FIG. 7) while the second pillar-shaped portion 110 supports an external terminal or a semiconductor chip (155 of FIG. 5) to be mounted. The leads 120 may be symmetrically arranged within the frame 145. The frame 145 may further include leads at its edges, each having the first 30 pillar-shaped portion 105 and the top plate 115.

Referring to FIG. 1, the lead frame 100 includes leads 121 which provide support to the packaged device. The semiconductor die (not shown) is placed either on the second pillar-shaped portions 110 of leads 120, or, as described herein, an extended portion of the top plate 116 of leads 121. Since the die is only supported on the periphery of the die, as shown by the chip mounting region 140, as there is no central die attach pad, there are leads 121 with a single pillar 111 and a top plate 116 that extends slightly beyond the pillar 111, which are electrically active, but also provide structural support for the device. Further, the semiconductor die may be connected to the leads 121 by wire bonding the die to the leads 121, thereby adding extra electrical connections to the packaged device.

Figure 3:
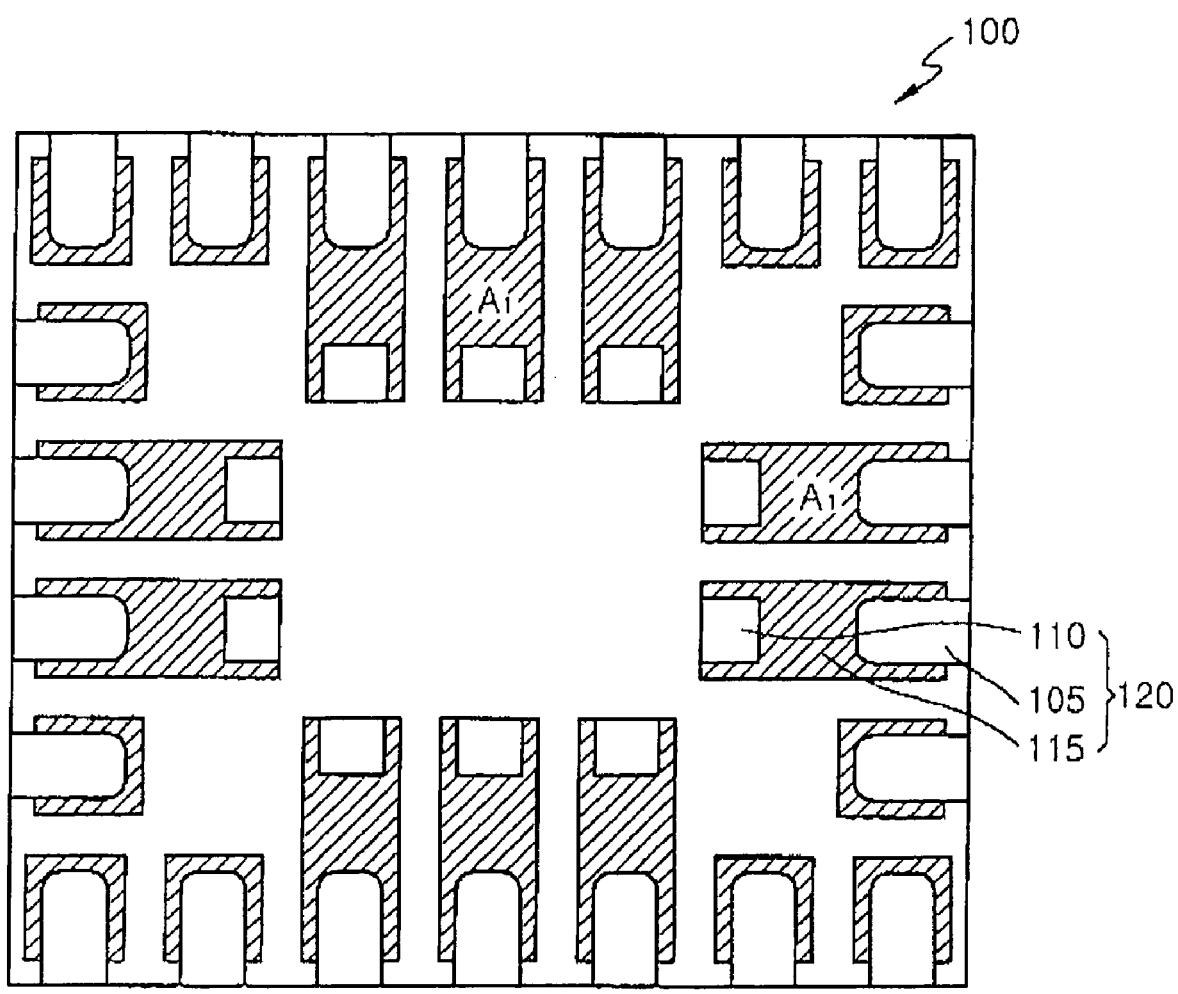
Figure 4:
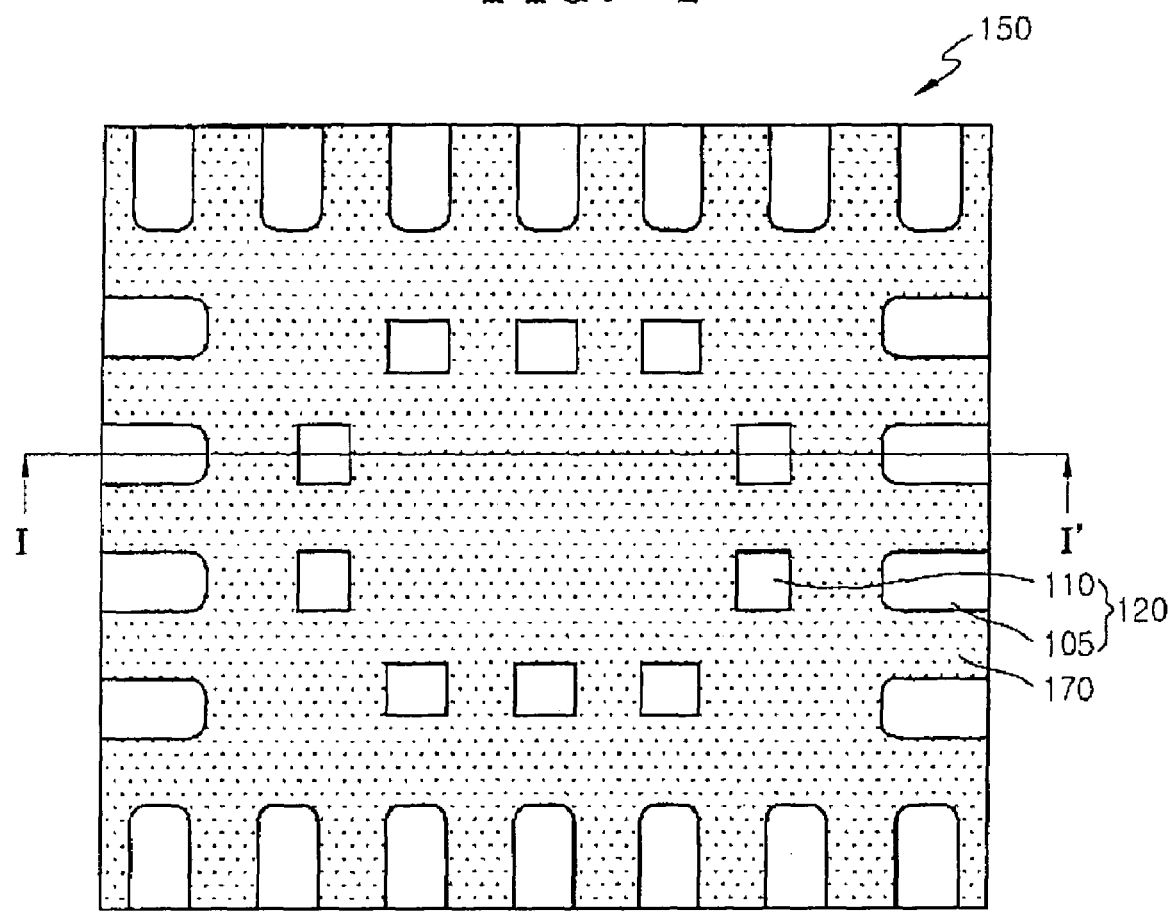
FIG. 4 is a schematic bottom view of a semiconductor package according to a first embodiment of the present invention.
Figure 5:
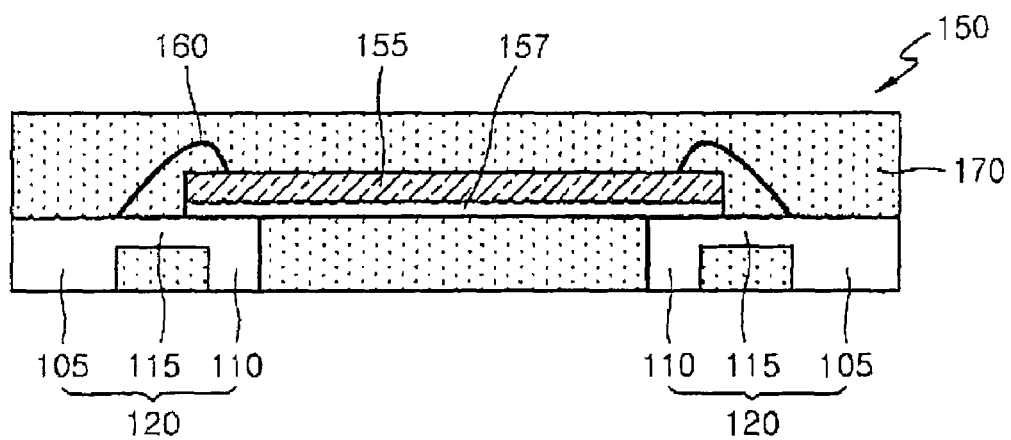
FIG. 5 is a cross-sectional view taken along line I-I' of the semiconductor package of FIG. 4.

Referring to FIG. 3, pillar-shaped portions 105 and 110 of the lead frame 100 are formed using half-etching. A half-etching region A1 is etched to a predetermined thickness to form the lead 120 having the gap 125, as shown in FIG. 2. Because the half-etching is well known to those skilled in the art, it is possible to economically manufacture the lead frame 100 using conventional apparatus and method. FIG. 4 is a schematic bottom view of a semiconductor package 150 according to a first embodiment of the present invention and FIG. 5 is a cross-sectional view taken along line I-I' of the semiconductor package 150. Because the semiconductor package 150 is manufactured using the lead frame 100, the construction of the semiconductor package 150 will now be described with reference to FIGS. 4 and 5 as well as FIG. 1 showing the lead frame 100 of the first embodiment of the present invention.

Referring to FIGS. 4 and 5, a semiconductor chip 155 is attached onto an edge of the top plate 115 of the lead 120 by an adhesive 157. A plurality of bonding pads (not shown) are formed on the semiconductor chip 155 and connected to the top plates 115 of the leads 120 by conductive wires 160. The semiconductor chip 155 and the wires 160 are encapsulated with a molding material 170. Only portions of each of the leads 120 are encapsulated with the molding material 170 so as to expose at least the bottom surfaces of the first and second pillar-shaped portions 105 and 110.

More specifically, the semiconductor chip 155 is attached onto the top plate 115 on the second pillar-shaped portion 110 so that it may be reliably supported by the second pillar-shaped portion 110. Thus, the small-sized semiconductor chip 155 can be mounted on the leads 120 by adjusting the length of the top plate 115. That is, the high-integrated semiconductor chip 155 requiring a large number of leads 120 can be reliably attached onto the lead 120 by increasing the size of the lead frame 100 thus the number of the leads 120 as well as the length of the top plate 115. Furthermore, because the half-etched top plate 115 can be supported by the second pillar-shaped portion 110, it is possible to prevent damage to the semiconductor chip 155 or the leads 120 due to bouncing during bonding of the wires 160.

The wires 160 may be formed of Pt, Au, Cu, Pd, Pb, or an alloy of the metals. The molding material 170 serves to protect the semiconductor chip 155 and the wires 160 against external physical impact or ingress of moisture. However, portions of each of the leads 120 must be exposed outside the molding material 170 for electrical contact to an external board. A gap between the first and second pillar-shaped portions 105 and 110 is filled with the molding material 170. Further, the outer lateral side of the first pillar-shaped portion 105 is exposed outside the molding material 170 during cutting of the lead frame 100. Alternatively, unlike in FIGS. 4 and 5, the outer lateral side of the first pillar-shaped portion 105 may be half-etched to expose a portion of the top plate 115 from the molding material 170. U.S. Pat. No. 6,437,429 issued to Chun-Jen Su, et al discusses an example in which a portion of the top plate 115 is exposed.

Figure 6:
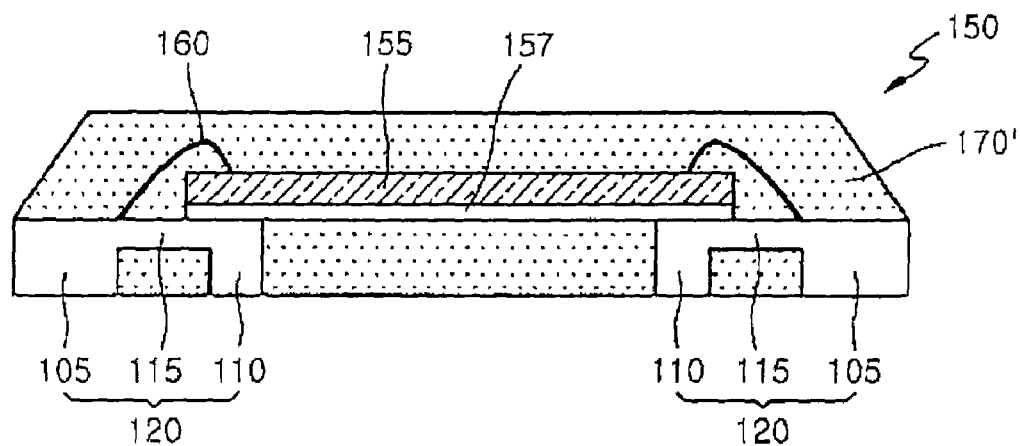
FIG. 6 shows a modified example of the semiconductor package shown in FIG. 5.

The molding material 170 for the semiconductor package 150 may have various shapes. For example, when a plurality of semiconductor packages 150 may be separated into individual packages 150 using a sawing process, side edges of the molding material 170 may be almost perpendicular to the semiconductor chip 155. As a modified example, when a plurality of semiconductor packages 150 are separated into individual packages using a punching method, a molding material 170' for a semiconductor package 150 may be inclined as shown in FIG. 6.

Figure 7:
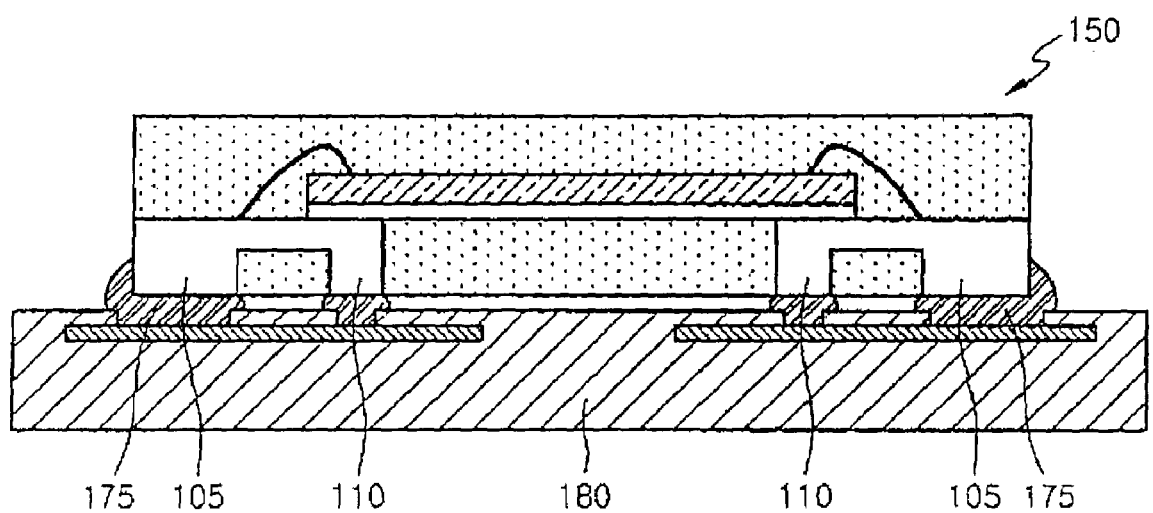
FIGS. 7 and 8 are cross-sectional views illustrating a method of mounting the semiconductor package of FIG. 4 onto boards.
Figure 8:
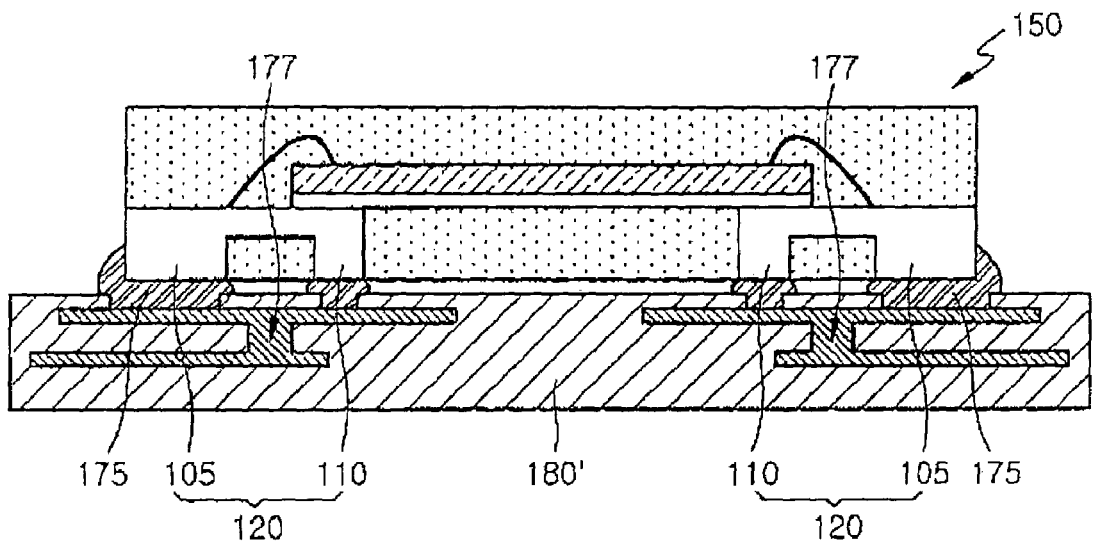

FIGS. 7 and 8 are cross-sectional views illustrating a method of mounting the semiconductor package 150 onto boards 180 and 180'. The board 180 may be a printed circuit board (PCB). When the semiconductor chip 150 is mounted on the board 180, the first and second pillar-shaped portions 105 and 110 are electrically connected to the board 180 by solders 175. Thus, the present invention improves reliability of electrical connection between the semiconductor package 150 and the board 180 compared to a conventional method whereby the semiconductor package 150 is electrically connected to the board 180 using only one pillar-shaped portion (e.g., the first pillar-shaped portion 105).

Further, it is possible to reliably mount the semiconductor package 150 on the board 180' having a via hole 177. For example, the two pillar-shaped portions 105 and 110 of the lead 120 may be attached to the board 180' by a solder 175 with the via hole formed there between as shown in FIG. 8, thereby preventing the occurrence of air trap within the via hole 177.

As described above, the semiconductor package 150 allows a high-integrated, small-sized semiconductor chip 155 having a large number of bonding pads to be reliably attached onto the leads 120. The semiconductor package 150 also allows the semiconductor chip 155 to be supported using the second pillar-shaped portion 110, thus preventing damage to the semiconductor chip 155 or the leads 120 due to bouncing during bonding of wires 160. Furthermore, the semiconductor package 150 provides improved reliability of attachment to the board 180 (board 180' having a via hole) by the solders 175.

Second Embodiment

Figure 9:
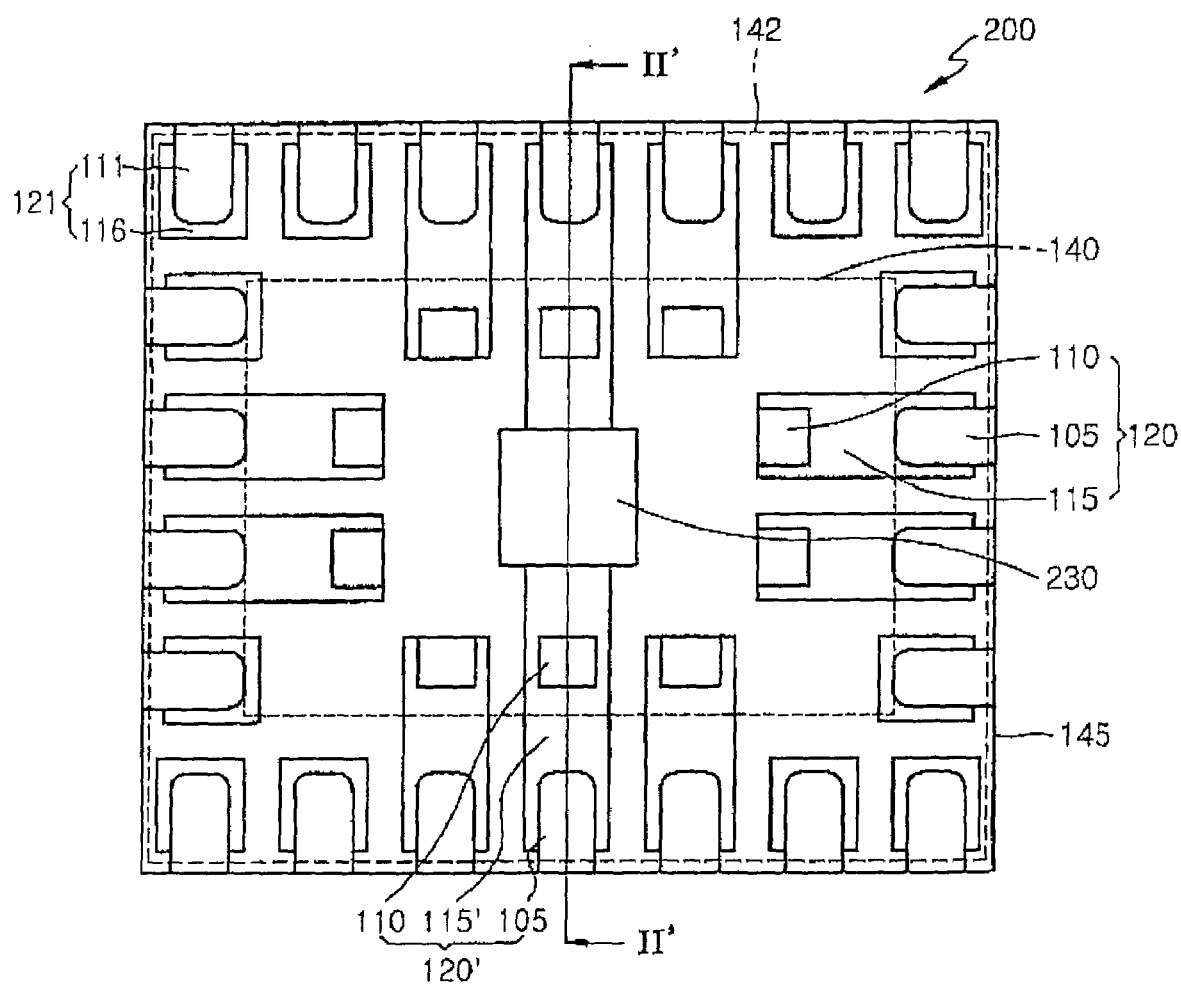
FIGS. 9 and 11 are schematic bottom views of a lead frame according to a second embodiment of the present invention.
Figure 10:
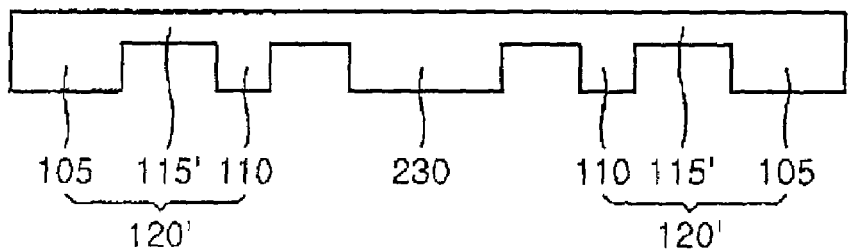
FIG. 10 is a cross-sectional view taken along line II-II' of the lead frame of FIG. 9.
Figure 11:
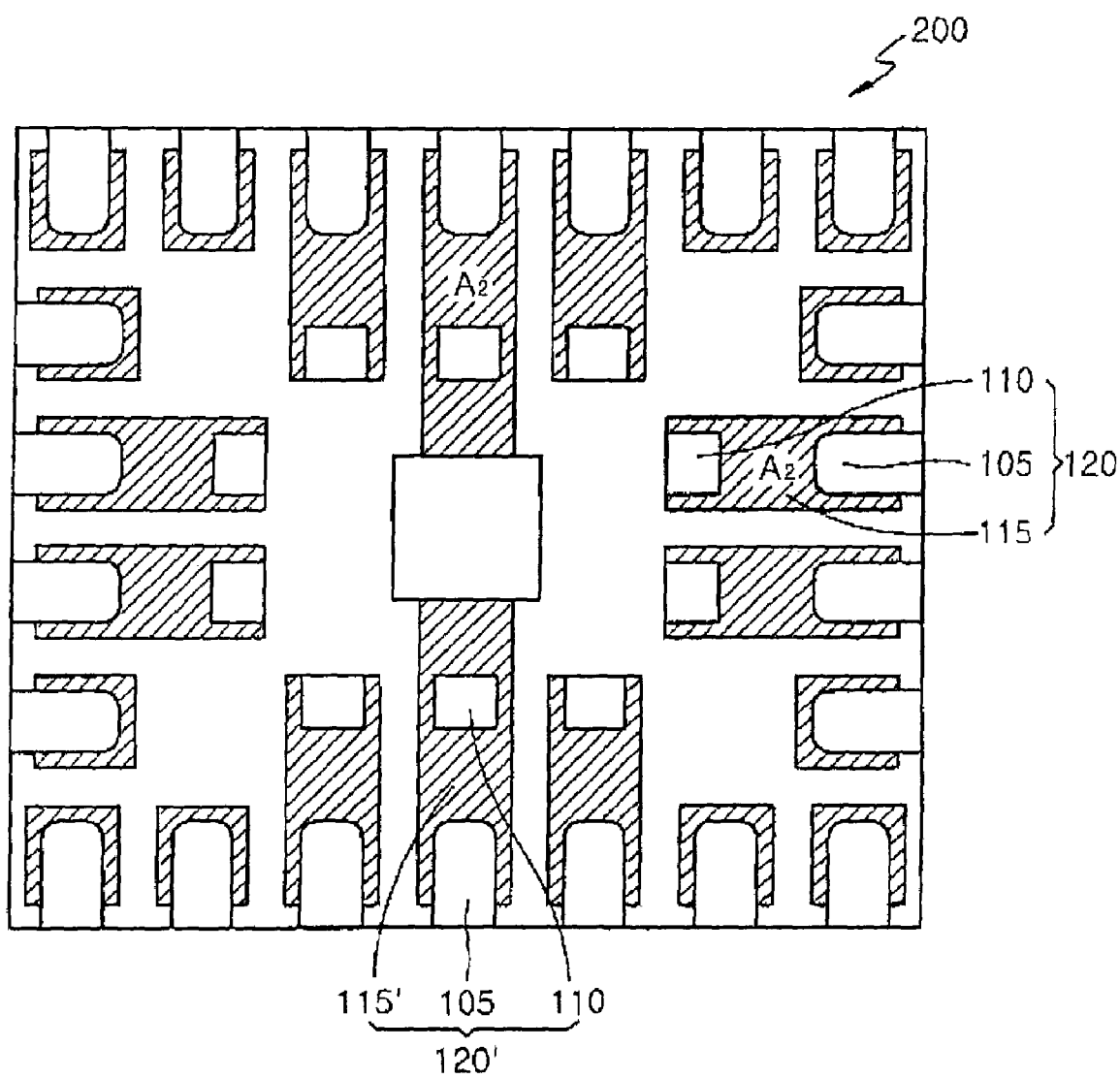

FIGS. 9 and 11 are schematic bottom views of a lead frame 200 according to a first embodiment of the present invention and FIG. 10 is a cross-sectional view taken along line II-II' of the lead frame 200. Like reference numerals in FIG. 1 and FIG. 9 denote like elements, and thus their description will not be given.

Referring to FIGS. 9 and 10, a conductive pad 230 is disposed on a central portion of the frame 145 inside leads 120 and connected to and fixed by a pair of leads 120'. For example, top plates 115' of the leads 120' may extend to connect with the top of the pad 230. The conductive pad 230 may be formed of Pb, Au, Pt, Cu, Sn, or an alloy of the metals.

The pair of leads 120' and the conductive pad 230 can serve as a heat sink for dissipating heat generated in a semiconductor chip to be mounted thereon. The pair of leads 120' connected to each other can also act as a common ground. In this case, it may be effective for fixing the pad 230 to arrange the pair of leads 120' in a line. Although FIG. 10 shows the pair of leads 120' are connected to the pad 230, additional leads 120' may be connected to the pad 230 for fixation.

Referring to FIG. 9, the lead frame 200 includes leads 121 which provide support to the packaged device. The semiconductor die (not shown) is placed either on the second pillar-shaped portions 110 of leads 120, 120', or, as described herein, an extended portion of the top plate 116 of leads 121. Since the die is supported on the periphery of the die, as shown by the chip mounting region 140, there are leads 121 with a single pillar 111 and a top plate 116 that extends slightly beyond the pillar 111, which are electrically active, but also provide structural support for the device. Further, the semiconductor die may be connected to the leads 121 by wire bonding the die to the leads 121, thereby adding extra electrical connections to the packaged device.

Referring to FIG. 11, the lead frame 200 may be formed by half-etching. Half-etching regions A2 of the lead frame 200 are etched from the bottom surface to a predetermined depth to separate between the pillar-shaped portions 105 and 110 of the leads 120 and the top plate 115 and between the pillar-shaped portions 105 and 110 of the leads 120' and the top plate 115'.

Figure 12:
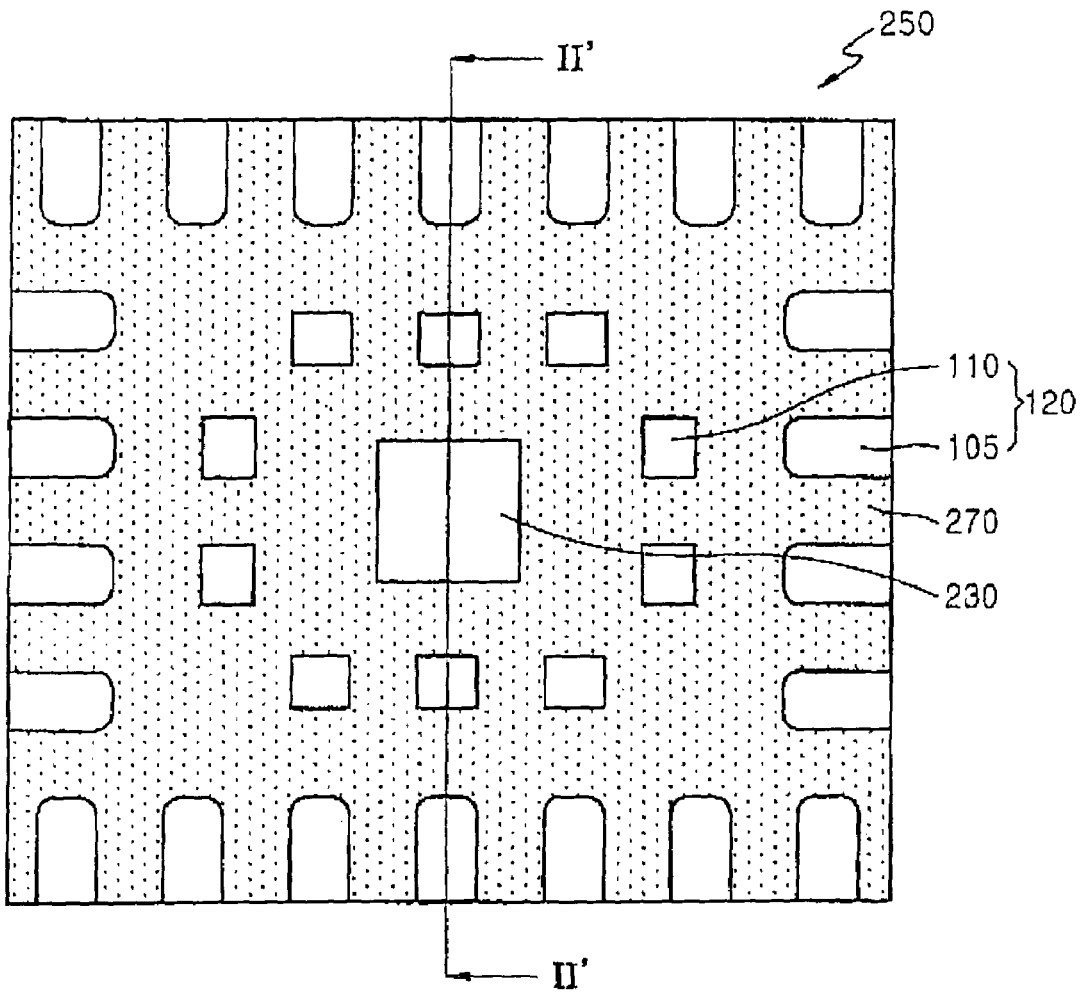
FIG. 12 is a schematic bottom view of a semiconductor package according to a second embodiment of the present invention.
Figure 13:
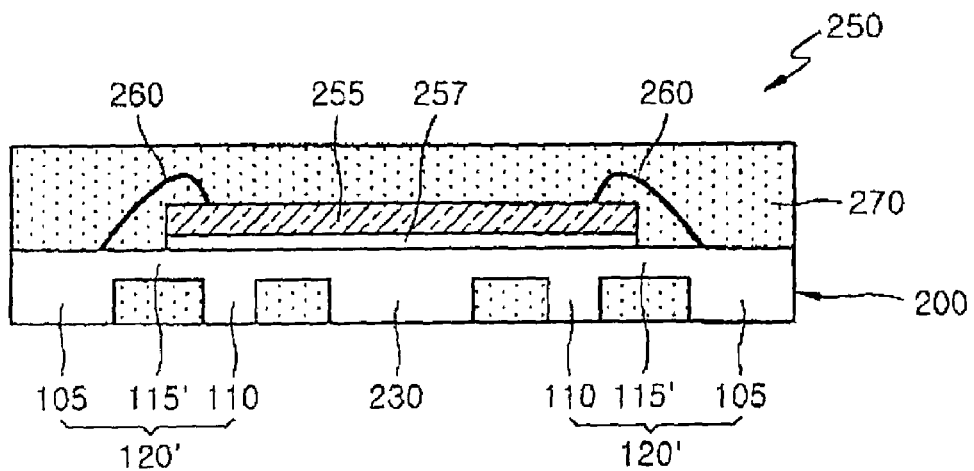
FIG. 13 is a cross-sectional view taken along line II-II' of the semiconductor package of FIG. 12.

FIG. 12 is a schematic bottom view of a semiconductor package 250 according to a second embodiment of the present invention and FIG. 13 is a cross-sectional view taken along line II-II' of the semiconductor package 250. Because the semiconductor package 250 is manufactured using the lead frame 200, shown in FIG. 9, the construction of the semiconductor package 250 will now be described with reference to FIGS. 12 and 13 as well as FIG. 4. Like reference numerals in FIGS. 4 and 12 denote like elements.

Referring to FIGS. 9, 12, and 13, a semiconductor chip 255 is attached onto edges of the top plates 115 and 115' of the leads 120 and 120' and the conductive pad 230 by an adhesive 257. A plurality of bonding pads (not shown) are formed on the semiconductor chip 255 and connected to the top plates 115 and 115' of the leads 120 and 120' by conductive wires 260. The semiconductor chip 255 and the wires 260 are encapsulated with a molding material 270. Only parts of the leads 120 and 120' are encapsulated with the molding material 270 so as to expose at least the bottom surfaces of the first and second pillar-shaped portions 105 and 110.

The semiconductor package 250 may have all advantages of the semiconductor package 150 according to the first embodiment of the present invention. The semiconductor package 250 is able to exhibit higher heat dissipation capability than the semiconductor package 150. For example, the semiconductor package 250 can effectively dissipate away heat generated in the semiconductor chip 255 through the pad 230 and the pair of leads 120'. Thus, the semiconductor package 250 is suitable for a package for the high power semiconductor chip 255 generating a large amount of heat.

A plurality of semiconductor packages 250 may be separated using a sawing process as well as a punching method as shown in FIG. 6. As described above with reference to FIGS. 7 and 8, the semiconductor package 250 also provides improved robustness of attachment to the board 180 or 180' while preventing the occurrence of air trap.

Third Embodiment

Figure 14:
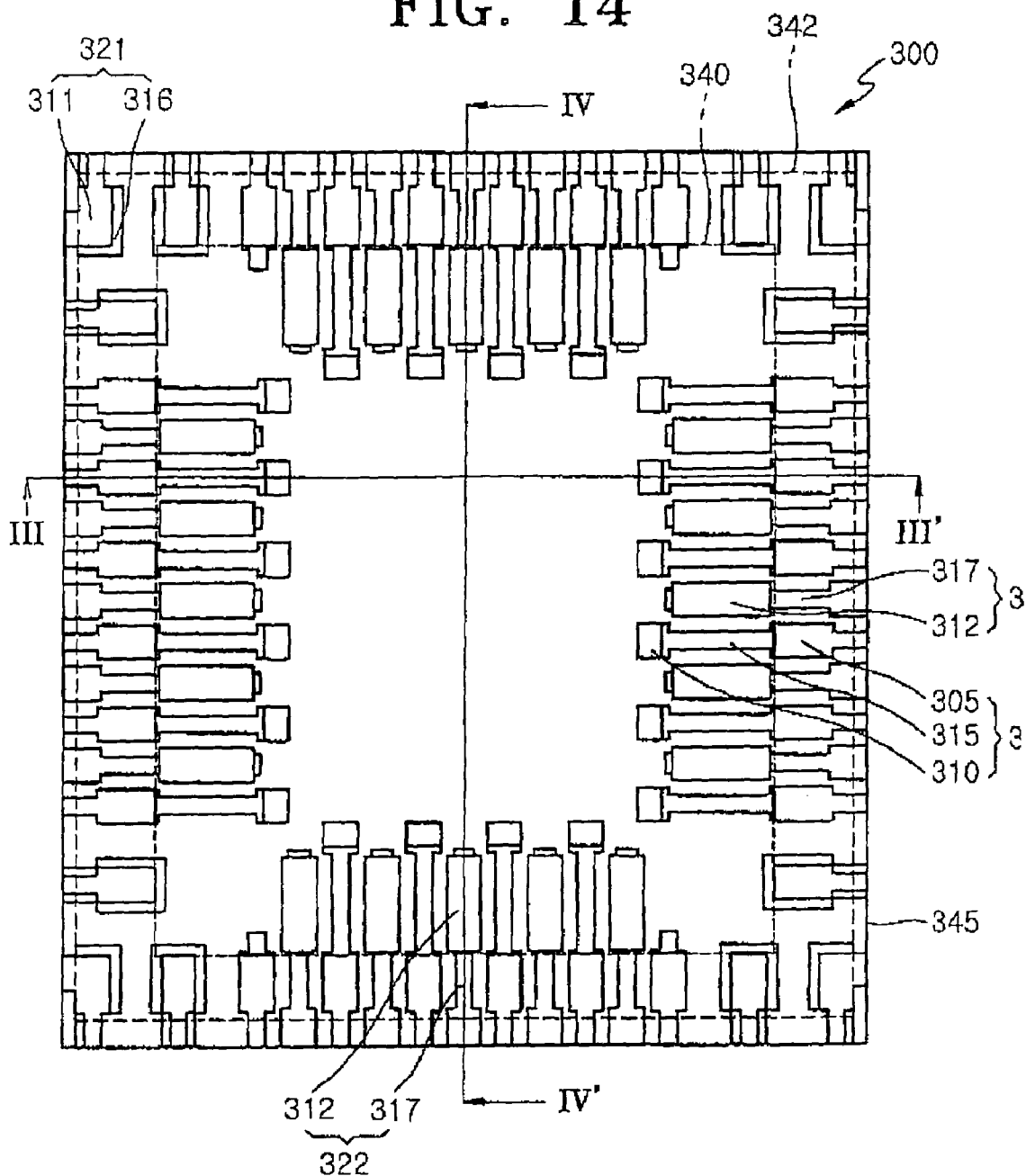
FIG. 14 is a schematic bottom view of a lead frame according to a third embodiment of the present invention.
Figure 15:
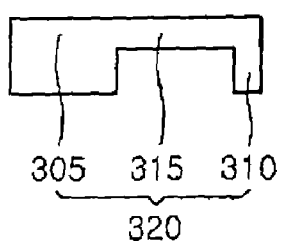
FIGS. 15 and 16 are cross-sectional views taken along lines III-III' and IV-IV' of the lead frames of FIG. 14, respectively.
Figure 15:
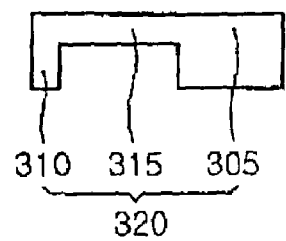
Figure 16:

FIG. 14 is a schematic bottom view of a lead frame 300 according to a third embodiment of the present invention and FIGS. 15 and 16 are cross-sectional views taken along lines III-III' and IV-IV' of the lead frames 300, respectively. The configuration of the lead frame 300 will now be described with reference to FIGS. 14-16 as well as FIG. 1.

Referring to FIG. 14, a lead frame 300 includes a plurality of first and second conductive leads 320 and 322 that are spaced and arranged alternately and a frame 345 fixing the leads 320 and 322. A cutting region 342 for cutting the leads 320 and 322 and a semiconductor chip mounting region 340 are defined within the frame 345. The semiconductor chip mounting region 340 is defined up to edges of the first conductive leads 320 or may extend to edges of the second conductive leads 322. The lead frame 300 may be a sawing type or punch type lead frame.

Referring to FIG. 14, the lead frame 300 includes leads 321 which provide support to the packaged device. The semiconductor die (not shown) is placed either on the leads 320, 322, or, as described herein, an extended portion of the top plate 316 of leads 321. Since the die is supported on the periphery of the die, as shown by the chip mounting region 340, there are leads 321 with a single pillar 311 and a top plate 316 that extends slightly beyond the pillar 311, which are electrically active, but also provide structural support for the device. Further, the semiconductor die may be connected to the leads 321 by wire bonding the die to the leads 321, thereby adding extra electrical connections to the packaged device.

Referring to FIGS. 14 through 16, each of the plurality of first leads 320 includes a first pillar-shaped portion 305, a second pillar-shaped portion 310, and a top plate 315 covering the first and second pillar-shaped portions 305 and 310. The first conductive leads 320 are spaced apart from one another and arranged so that the second pillar-shaped portions 310 face the inside of the frame 345. Because the first conductive lead 320 has a similar configuration to the lead 120 according to the first embodiment of the present invention, a detailed explanation thereof will be omitted.

Each of the plurality of second conductive leads 322 includes a third pillar-shaped portion 312 and a top plate 317 covering the third pillar-shaped portion 312. The second conductive leads 322 are arranged alternately within the frame 345 with the first conductive leads 320 so that the third pillar-shaped portions 312 face the inside of the frame 345. In order to effectively increase the number of the first and second conductive leads 320 and 322, the third pillar-shaped portion 312 may be disposed between the first and second pillar-shaped portions 305 and 310 of the first conductive lead 320.

As described above with reference to FIG. 14, the lead frame 300 may be formed using a half-etching technique. A half-etching region (not shown) may be a bottom surface of the top plate 315 exposed by the first and second pillar-shaped portions 305 and 310 of the first conductive lead 320 or a bottom surface of the top plate 317 exposed by the third pillar-shaped portion 312 of the second conductive lead 322.

The lead frame 300 may have all advantages of the lead frame 100 according to the first embodiment of the present invention. The lead frame 300 is configured to include the first and second conductive leads 320 and 322 alternately arranged, thereby effectively increasing the number of the leads 320 and 322 within the same frame 345.

Figure 17:
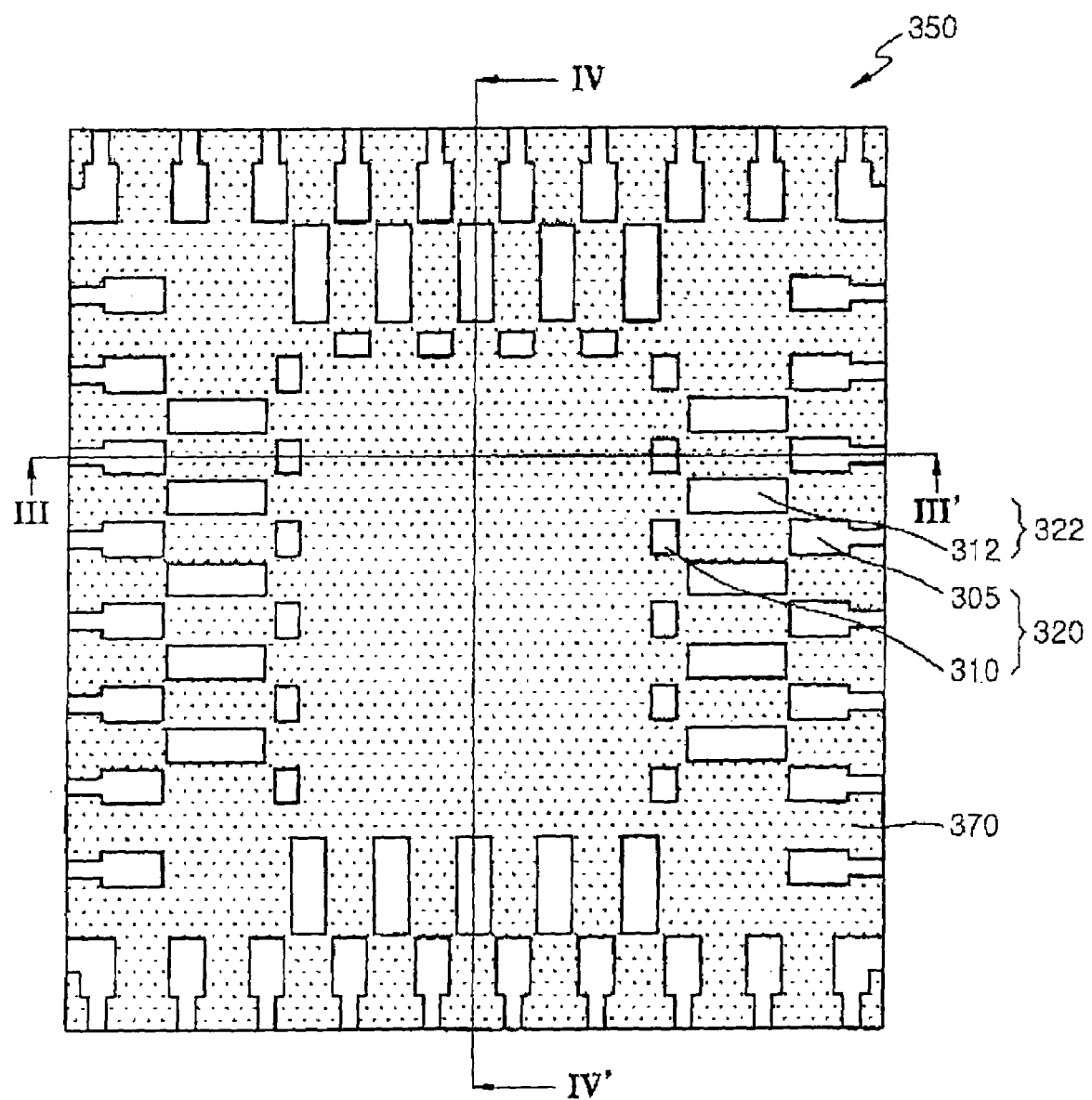
FIG. 17 is a schematic bottom view of a semiconductor package according to a third embodiment of the present invention.
Figure 18:
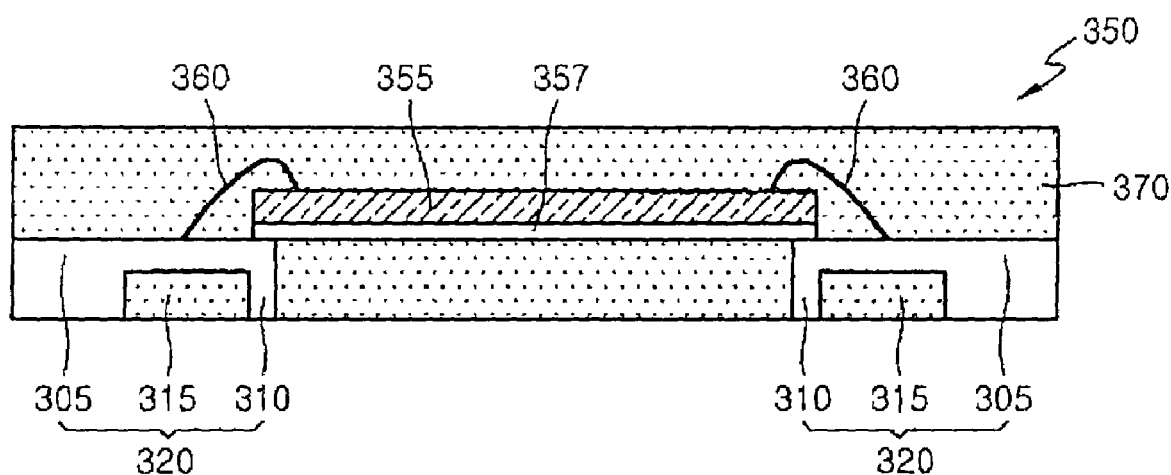
FIGS. 18 and 19 are cross-sectional views taken along lines III-III' and IV-IV' of the semiconductor package of FIG. 17, respectively.
Figure 19:
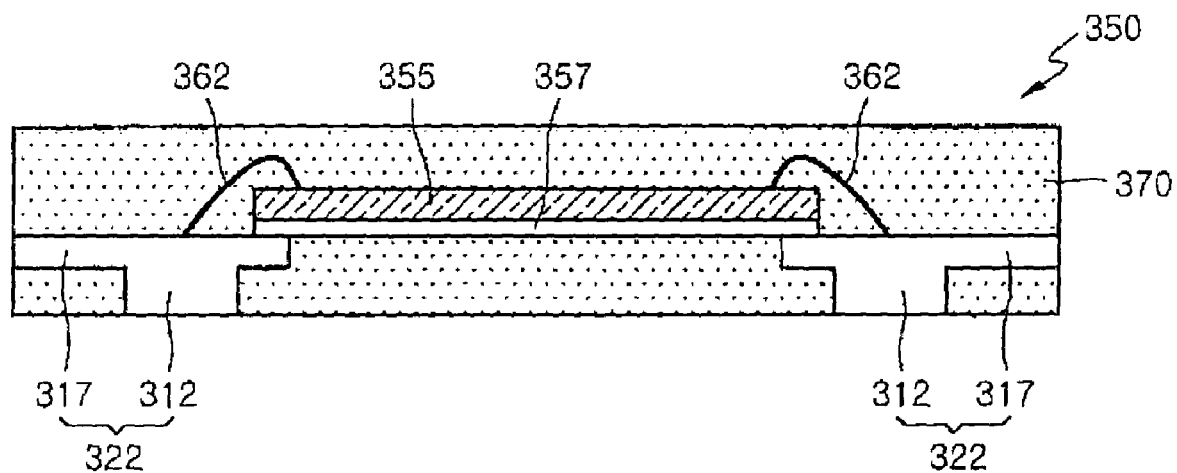

FIG. 17 is a schematic bottom view of a semiconductor package 350 according to a third embodiment of the present invention and FIGS. 18 and 19 are cross-sectional views taken along lines III-III' and IV-IV' of the semiconductor package 350, respectively. The semiconductor package 350 may be manufactured using the lead frame 300, shown in FIG. 14. The construction of the semiconductor package 350 will now be described with reference to FIGS. 17-19 as well as FIGS. 4 and 12 respectively showing the semiconductor packages 150 and 250 of the first and second embodiments.

Referring to FIGS. 17-19, a semiconductor chip 355 is attached onto edges of the top plates 315 and 317 of the first and second conductive leads 320 and 322 by an adhesive 357. In a modification of the third embodiment, the semiconductor chip 355 may be attached onto the edges of the top plates 315 of only the first conductive leads 320 and supported by the second pillar-shaped portions 310. The semiconductor chip 355 can further be reliably supported by the third pillar-shaped portions 312, thereby allowing reliable attachment of the semiconductor chip 355 to the leads 320 and 322 within the semiconductor package 350.

A plurality of bonding pads (not shown) are formed on the semiconductor chip 355 and connected to the first leads 320 by conductive wires 360. Some of the bonding pads on the semiconductor chip 355 are connected to the first leads 320 by first conductive wires 360 while the remaining pads are connected to the second leads 322 by second conductive wires 362. For example, the first and second conductive wires 360 and 362 may be connected to the top plates 315 and 317 of the first and second conductive leads 320 and 322, respectively.

The semiconductor chip 355 and the first and second conductive wires 360 and 362 are encapsulated with a molding material 370. Parts of the first conductive leads 320 are encapsulated with the molding material 370 so as to expose at least the bottom surfaces of the first and second pillar-shaped portions 305 and 310. Parts of the second conductive leads 322 are encapsulated with the molding material 370 so as to expose the bottom surface of the third pillar-shaped portion 312. At least one cutting side of the first pillar-shaped portion 305 and at least one cutting side of the top plate 317 can further be exposed from the molding material 370.

The semiconductor package 350 may have all advantages of the semiconductor package 150 of the first embodiment. The semiconductor package 350 has a larger number of leads 320 and 322 than the same sized semiconductor package (e.g., the semiconductor package 150), thereby allowing the small-sized high integrated semiconductor chip 355 to be packaged in a smaller package. The semiconductor package 350 is suitable for use in high-capacity compact devices.

Fourth Embodiment

Figure 20:
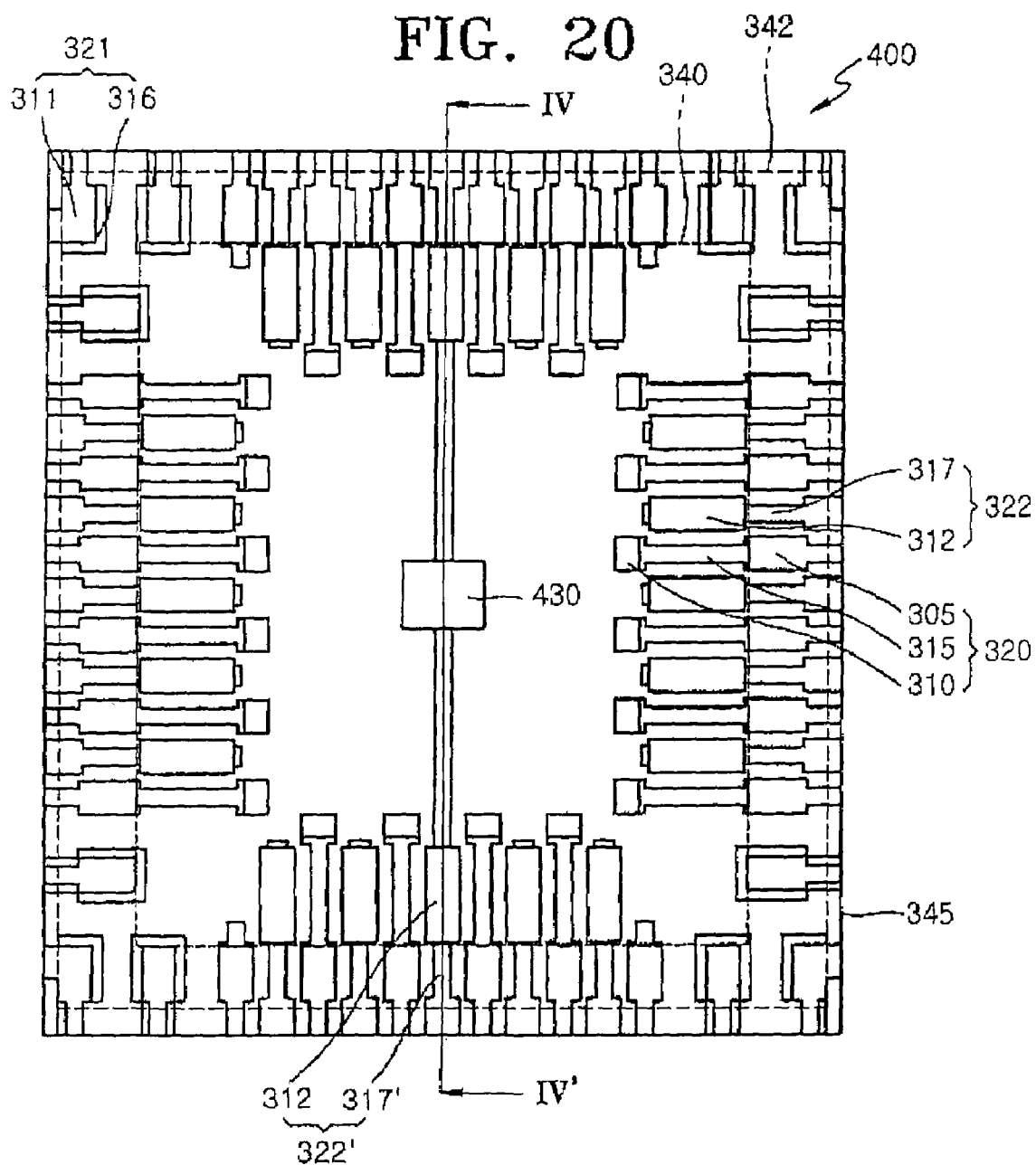
FIG. 20 is a schematic bottom view of a lead frame according to a fourth embodiment of the present invention.
Figure 21:
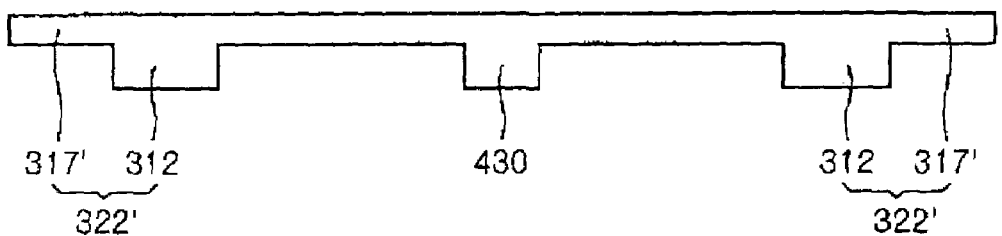
FIG. 21 is a cross-sectional view taken along line IV-IV' of the lead frame of FIG. 20.

FIG. 20 is a schematic bottom view of a lead frame according to a fourth embodiment of the present invention and FIG. 21 is a cross-sectional view taken along line IV-IV' of the lead frame of FIG. 20. The configuration of the lead frame 400 will now be described with reference to FIGS. 20 and 21 as well as FIGS. 9 and 14 respectively showing the lead frames 200 and 300. Like reference numerals in the drawings denote like elements.

Referring to FIGS. 20 and 21, a conductive pad 430 is disposed on a central portion of a frame 345 inside first and second leads 320, 322, and connected to a pair of second leads 322' for fixation. For example, top plates 317' of the second leads 322' may extend to connect with the top of the conductive pad 430. Although FIG. 20 shows the pair of second leads 322' are connected to the pad 430, additional leads 322' may be connected to the pad 430 for fixation. Alternatively, the first leads 320 or both the first and second leads 320 and 322' may be connected to the pad 430.

As described in the second embodiment, the pair of leads 322' and the conductive pad 430 can serve as a heat sink for dissipating heat generated in a semiconductor chip to be mounted thereon. The pair of leads 322' connected to each other can also act as a common ground. In this case, it may be effective for fixing the pad 430 to arrange the pair of leads 322' in a line. As described in the first through third embodiments, the lead frame 400 may be formed by half-etching.

Referring to FIG. 20, the lead frame 400 includes leads 321 which provide support to the packaged device. The semiconductor die (not shown) is placed either on the leads 320, 322, 322' or, as described herein, an extended portion of the top plate 316 of leads 321. Since the die is supported on the periphery of the die, as shown by the chip mounting region 340, there are leads 321 with a single pillar 311 and a top plate 316 that extends slightly beyond the pillar 311, which are electrically active, but also provide structural support for the device. Further, the semiconductor die may be connected to the leads 321 by wire bonding the die to the leads 321, thereby adding extra electrical connections to the packaged device.

Figure 22:
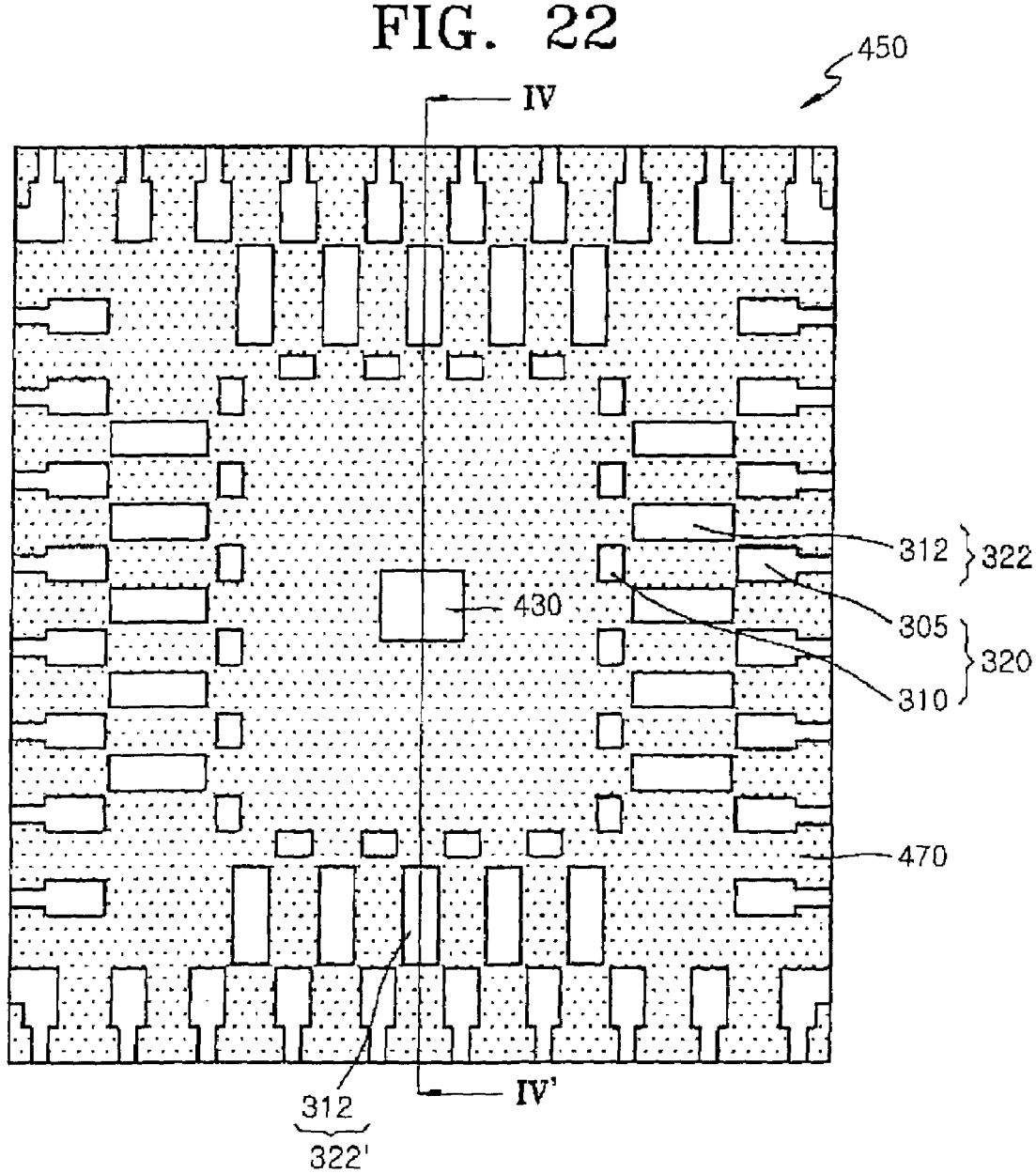
FIG. 22 is a schematic bottom view of a semiconductor package according to a fourth embodiment of the present invention.
Figure 23:
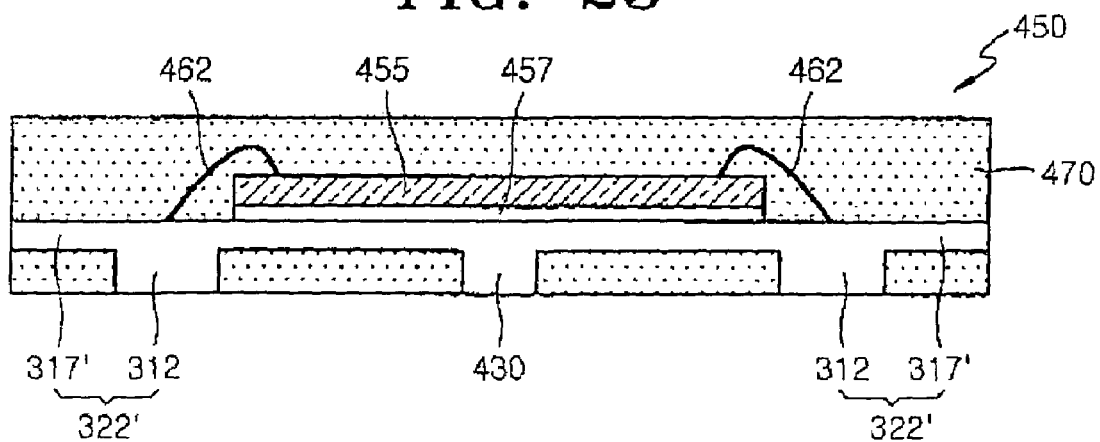
FIG. 23 is a cross-sectional view taken along line IV-IV' of the semiconductor package of FIG. 22.

FIG. 22 is a schematic bottom view of a semiconductor package 450 according to a fourth embodiment of the present invention and FIG. 23 is a cross-sectional view taken along line IV-IV' of the semiconductor package 450. The semiconductor package 450 may be manufactured using the lead frame 400. The construction of the semiconductor package 450 will now be described with reference to FIGS. 22 and 23 as well as FIGS. 4, 12, and 17 respectively showing the semiconductor packages 150, 250, and 350 of the first through third embodiments. Like reference numerals in the drawings denote like elements.

Referring to FIGS. 20, 22, and 23, a semiconductor chip 455 is attached onto edges of the top plates 315, 317, and 317' of the first and second leads 320, 322, and 322' and a pad 430 by an adhesive 457. Some of bonding pads (not shown) on the semiconductor chip 455 are connected to the top plates 317' of the leads 322' by conductive wires 462 while the remaining pads are connected to the leads 320 and 322 by other conductive wires (not shown) (See FIGS. 18 and 19). The semiconductor chip 455 and the conductive wires 462 are encapsulated with a molding material 470. Parts of the first and second leads 320, 322, and 322' are encapsulated with the molding material 470 so as to expose at least the bottom surfaces of the pillar-shaped portions 305, 310, and 312.

The semiconductor package 450 may have all advantages of the semiconductor package 350 according to the first embodiment of the present invention. The semiconductor package 450 is able to exhibit higher heat dissipation capability than the semiconductor package 350. For example, the semiconductor package 450 can effectively dissipate away heat generated in the semiconductor chip 455 through the pad 430 and the pair of leads 322'. Thus, the semiconductor package 450 is suitable for a package for the high power semiconductor chip 455 generating a large amount of heat.

A plurality of semiconductor packages 450 may be separated into individual packages using a sawing process as well as a punching method as shown in FIG. 6. As described above with reference to FIGS. 7 and 8, the semiconductor package 450 also provides improved robustness of attachment to the board 180 or 180' while preventing the occurrence of air trap. The semiconductor package 450 also has all advantages of the semiconductor package 350 of the third embodiment. The pad 430 in the semiconductor package 450 helps to effectively dissipate heat generated in the semiconductor chip 455.

While the present invention has been particularly shown and described with reference to exemplary embodiments thereof, it will be understood by those of ordinary skill in the art that various changes in form and details such as a combination of the embodiments may be made therein without departing from the spirit and scope of the present invention as defined by the following claims.

What is claimed is:

1. A packaged semiconductor comprising:
   a plurality of first conductive leads, each including first and second pillar-shaped portions and a top plate covering the tops of the first and second pillar-shaped portions, which are spaced apart from one another and arranged such that the second pillar-shaped portions face inward, wherein the lateral length of the top plate is greater than the corresponding lateral length of one of the first and second pillar shaped portions;
   a semiconductor chip having a top surface on which a plurality of bonding pads are disposed and edge portions attached onto edges of top plates of the first conductive leads;
   a plurality of first conductive wires connecting at least some of the bonding pads on the semiconductor chip with corresponding ones of the first conductive leads;
   a molding material encapsulating the semiconductor chip and the first conductive wires and parts of the first conductive leads so as to expose at least bottom surfaces of the first and second pillar-shaped portions of the first conductive leads the packaged semiconductor further comprising:
      a plurality of second conductive leads, each including respective first, second, and third pillar-shaped portions and a top plate covering the first, second, and third pillar-shaped portions, which are spaced apart from and arranged alternately with the first conductive; and a plurality of second conductive wires connecting at least some of the bonding pads on the semiconductor chip with corresponding ones of the second conductive leads;

wherein the molding material further encapsulates portions of the second conductive leads so as to expose the bottom surfaces of plurality of second conductive leads, wherein the edge portions of the semiconductor chip are attached onto edge portions of the top plates of the second conductive leads.

2. The packaged semiconductor of claim 1, wherein the edge portions of the semiconductor chip are attached onto the top plates on the second pillar-shaped portions of the first conductive leads.

3. The packaged semiconductor of claim 2, wherein the molding material encapsulates a gap between the first and second pillar-shaped portions of the first conductive leads.

4. The packaged semiconductor of claim 2, wherein the molding material further exposes at least one side of the first pillar-shaped portion of each of the first conductive leads.

5. The packaged semiconductor of claim 1, further comprising a conductive pad attached onto a central portion of a bottom surface of the semiconductor chip and disposed at a central portion inside the first conductive leads, wherein the molding material further encapsulates a portion of the conductive pad so as to expose the bottom surface of the conductive pad.

6. The packaged semiconductor of claim 5, wherein the conductive pad connects with top plates of at least one pair of the first conductive leads.

7. The packaged semiconductor of claim 1, wherein the edge portions of the semiconductor chip are further attached onto the top plates on the third pillar-shaped portions of the second conductive leads.

8. A packaged semiconductor comprising:
a plurality of first conductive leads, each including spaced-apart first and second pillar-shaped portions and a top plate covering the first and second pillar-shaped portions, which are spaced apart from one another and arranged such that the second pillar-shaped portions face inward;
a plurality of second conductive leads, each including a first, second, and third pillar-shaped portions and a top plate covering the first, second, and third pillar-shaped portions, which are spaced apart from and arranged alternately with the first conductive leads;
a semiconductor chip having a top surface on which a plurality of bonding pads are disposed and edge portions attached onto at least edges of top plates of the first conductive leads;
a plurality of conductive wires connecting the bonding pads on the semiconductor chip with corresponding ones of the first and second conductive leads;
a molding material encapsulating the semiconductor chip and the plurality of conductive wires and parts of the first and second conductive leads so as to expose at least bottom surfaces of the first and second pillar-shaped portions of the first conductive leads and the second conductive leads the packaged semiconductor further comprising a conductive pad attached beneath a bottom surface of the semiconductor chip and disposed at a central portion inside the first and second conductive leads,
wherein the molding material further encapsulates a portion of the conductive pad so as to expose the bottom surface of the conductive pad, wherein the conductive pad connects with top plates of at least one pair of the first conductive leads.

9. The packaged semiconductor of claim 8, wherein the edge portions of the semiconductor chip are attached onto the top plates on the second pillar-shaped portions of the first conductive leads.

10. The packaged semiconductor of claim 9, wherein the edge portions of the semiconductor chip are further attached onto the top plates of the second conductive leads.

11. The packaged semiconductor of claim 8, wherein the conductive pad connects with top plates of at least one pair of the second conductive leads.

12. A lead frame for a packaged semiconductor, comprising:
a plurality of half-etched first conductive leads, each including first and second pillar-shaped portions and a top plate covering at least the first and second pillar-shaped portions, which are spaced apart from one another and arranged such that the second pillar-shaped portions face inward;
a plurality of second conductive leads, each including respective first, second, and third pillar-shaped portion portions and a top plate covering the first, second and third pillar-shaped which are spaced apart from and arranged alternately with the first conductive leads;
a conductive pad disposed on a central portion of the frame inside the first conductive leads, and
wherein the conductive pad connects with the top plates of at least one pair of the first conductive leads.

13. The lead frame of claim 12, further comprising the conductive pad disposed on a central portion of the frame inside the second conductive leads, and
wherein the conductive pad connects with the top plates of at least one pair of the second conductive leads.

* * * * *